(12) United States Patent
Bernard et al.

(10) Patent No.: US 10,318,032 B2
(45) Date of Patent: Jun. 11, 2019

(54) MULTILAYER CAPACITIVE DETECTION DEVICE, AND APPARATUS COMPRISING THE DEVICE

(71) Applicant: QUICKSTEP TECHNOLOGIES LLC, Wilmington, DE (US)

(72) Inventors: Christophe Bernard, Claix (FR); Christophe Blondin, Sunnyvale, CA (US)

(73) Assignee: Quickstep Technologies LLC, Wilmington, DE (US)

( * ) Notice: Subject to any disclaimer, the term of this patent is extended or adjusted under 35 U.S.C. 154(b) by 0 days.

(21) Appl. No.: 15/548,408

(22) PCT Filed: Feb. 3, 2016

(86) PCT No.: PCT/US2016/016472
§ 371 (c)(1),
(2) Date: Aug. 2, 2017

(87) PCT Pub. No.: WO2016/126893
PCT Pub. Date: Aug. 11, 2016

(65) Prior Publication Data
US 2018/0032187 A1 Feb. 1, 2018

(30) Foreign Application Priority Data
Feb. 4, 2015 (FR) ...................................... 15 50843

(51) Int. Cl.
*G06F 3/044* (2006.01)
*G06F 3/041* (2006.01)
(Continued)

(52) U.S. Cl.
CPC ............ *G06F 3/0412* (2013.01); *G06F 3/044* (2013.01); *G02F 1/13338* (2013.01);
(Continued)

(58) Field of Classification Search
CPC ....................... G06F 3/044; G06F 2203/04107
See application file for complete search history.

(56) References Cited

U.S. PATENT DOCUMENTS

| 3,743,865 A | 7/1973 | Riechmann |
| 5,483,261 A | 1/1996 | Yasutake |

(Continued)

FOREIGN PATENT DOCUMENTS

| CN | 102 455 831 A | 5/2012 |
| CN | 204 102 115 U | 1/2015 |

(Continued)

OTHER PUBLICATIONS

Machine translation for CN 204102115.*
(Continued)

*Primary Examiner* — Michael Pervan
(74) *Attorney, Agent, or Firm* — Morrison & Foerster LLP

(57) ABSTRACT

The present invention relates to a capacitive detection device, comprising a plurality of individual capacitive measuring electrodes (12) distributed according to a measuring surface, and connecting tracks (20) respectively connected to said measuring electrodes (12), wherein the measuring electrodes (12) and the connecting tracks (20) are arranged according to two distinct optically clear layers separated by an electrically insulating insulation material (53).
The invention also relates to a method for manufacturing the device, and an apparatus comprising the device.

16 Claims, 2 Drawing Sheets

Figure 1:
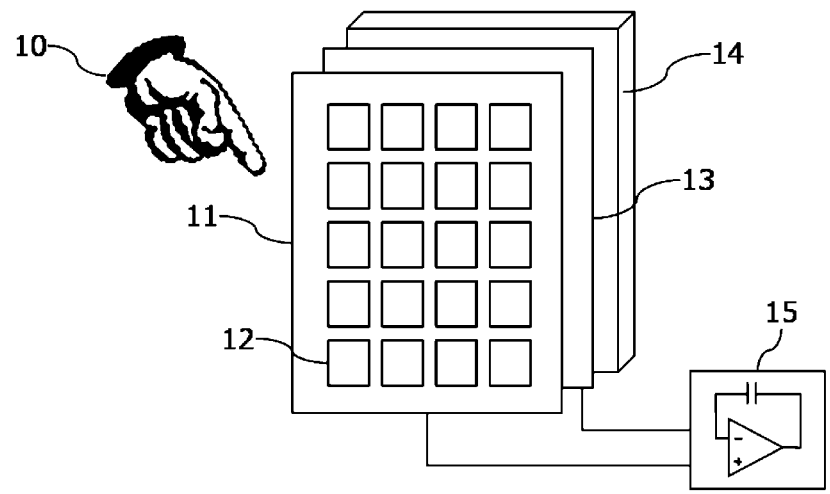

(51) Int. Cl.
*G02F 1/1333* (2006.01)
*H01L 27/32* (2006.01)

(52) U.S. Cl.
CPC .............. *G06F 2203/04103* (2013.01); *G06F 2203/04107* (2013.01); *G06F 2203/04112* (2013.01); *H01L 27/323* (2013.01)

(56) References Cited

U.S. PATENT DOCUMENTS

| | | |
|---|---|---|
| 5,488,204 A | 1/1996 | Mead et al. |
| 5,546,005 A | 8/1996 | Rauchwerger |
| 5,757,196 A | 5/1998 | Wetzel |
| 5,825,352 A | 10/1998 | Bisset et al. |
| 5,835,079 A | 11/1998 | Shieh |
| 5,844,506 A | 12/1998 | Binstead |
| 5,862,248 A | 1/1999 | Salatino et al. |
| 5,877,424 A | 3/1999 | Hegner et al. |
| 5,880,411 A | 3/1999 | Gillespie et al. |
| 5,956,415 A | 9/1999 | McCalley et al. |
| 6,188,391 B1 | 2/2001 | Seely et al. |
| 6,310,610 B1 | 10/2001 | Beaton et al. |
| 6,323,846 B1 | 11/2001 | Westerman et al. |
| 6,593,755 B1 | 7/2003 | Rosengren |
| 6,690,387 B2 | 2/2004 | Zimmerman et al. |
| 6,847,354 B2 | 1/2005 | Vranish |
| 7,005,864 B2 | 2/2006 | Lannello et al. |
| 7,015,894 B2 | 3/2006 | Morohoshi |
| 7,119,554 B2 | 10/2006 | Nakamura et al. |
| 7,184,064 B2 | 2/2007 | Zimmerman et al. |
| 7,301,350 B2 | 11/2007 | Hargreaves et al. |
| 7,570,064 B2 | 8/2009 | Roziere |
| 7,663,607 B2 | 2/2010 | Hotelling et al. |
| 8,149,002 B2 | 4/2012 | Ossart et al. |
| 8,159,213 B2 | 4/2012 | Roziere |
| 8,479,122 B2 | 7/2013 | Hotelling et al. |
| 8,659,407 B2 | 2/2014 | Merkel et al. |
| 8,770,033 B2 | 7/2014 | Roziere |
| 8,917,256 B2 | 12/2014 | Roziere |
| 8,970,537 B1* | 3/2015 | Shepelev ................ G06F 3/044 178/18.01 |
| 9,035,903 B2 | 5/2015 | Binstead |
| 9,104,283 B2 | 8/2015 | Roziere et al. |
| 9,250,757 B2 | 2/2016 | Roziere |
| 9,535,547 B2 | 1/2017 | Roziere |
| 9,581,628 B2 | 2/2017 | Setlak et al. |
| 9,939,956 B2 | 4/2018 | Slindee et al. |
| 9,983,746 B2 | 5/2018 | Roziere |
| 2006/0038642 A1 | 2/2006 | Goins |
| 2006/0097733 A1 | 5/2006 | Roziere |
| 2006/0197753 A1 | 9/2006 | Hotelling |
| 2006/0284639 A1 | 12/2006 | Reynolds |
| 2007/0138587 A1 | 6/2007 | Shin et al. |
| 2007/0222021 A1 | 9/2007 | Yao |
| 2008/0284261 A1 | 11/2008 | Andrieux et al. |
| 2008/0297675 A1 | 12/2008 | Kim |
| 2010/0011877 A1 | 1/2010 | Izumi et al. |
| 2010/0052700 A1 | 3/2010 | Yano et al. |
| 2010/0134438 A1 | 6/2010 | Yu et al. |
| 2010/0259283 A1 | 10/2010 | Togura |
| 2011/0001549 A1 | 1/2011 | Van Gastel |
| 2011/0007030 A1 | 1/2011 | Mo et al. |
| 2011/0169783 A1 | 7/2011 | Wang et al. |
| 2012/0044662 A1 | 2/2012 | Kim et al. |
| 2012/0050203 A1 | 3/2012 | Osoinach et al. |
| 2012/0161793 A1 | 6/2012 | Satake et al. |
| 2012/0169652 A1 | 7/2012 | Chang |
| 2012/0187965 A1 | 7/2012 | Roziere |
| 2012/0188200 A1 | 7/2012 | Roziere |
| 2012/0229414 A1 | 9/2012 | Ellis |
| 2012/0289022 A1 | 11/2012 | Kiehlbauch et al. |
| 2013/0033469 A1 | 2/2013 | Itoh et al. |
| 2013/0050132 A1 | 2/2013 | Calpe Maravilla et al. |
| 2013/0135247 A1 | 5/2013 | Na et al. |
| 2013/0162596 A1 | 6/2013 | Kono et al. |
| 2013/0307776 A1 | 11/2013 | Roziere |
| 2014/0132335 A1 | 5/2014 | Rauhala et al. |
| 2014/0267165 A1 | 9/2014 | Roziere |
| 2014/0347573 A1* | 11/2014 | Mockarram-Dorri ... G01D 5/24 349/12 |
| 2014/0360854 A1 | 12/2014 | Roziere |
| 2015/0029144 A1 | 1/2015 | Jo et al. |
| 2015/0035792 A1 | 2/2015 | Roziere et al. |
| 2015/0040667 A1 | 2/2015 | Tanaka |
| 2015/0048850 A1 | 2/2015 | Neel et al. |
| 2015/0068897 A1 | 3/2015 | Neel et al. |
| 2016/0034102 A1 | 2/2016 | Roziere et al. |
| 2016/0054813 A1 | 2/2016 | Schediwy et al. |
| 2016/0179247 A1 | 6/2016 | Blondin |
| 2016/0188038 A1 | 6/2016 | Roziere |
| 2016/0291730 A1 | 10/2016 | Roziere |
| 2016/0322351 A1 | 11/2016 | Moens et al. |
| 2016/0357338 A1 | 12/2016 | Roziere et al. |
| 2017/0068352 A1 | 3/2017 | Blondin et al. |
| 2017/0108968 A1 | 4/2017 | Roziere |
| 2017/0108978 A1 | 4/2017 | Blondin et al. |
| 2017/0220156 A1 | 8/2017 | Blondin et al. |

FOREIGN PATENT DOCUMENTS

| | | |
|---|---|---|
| EP | 2 096 526 A2 | 9/2009 |
| EP | 2 267 791 A2 | 12/2010 |
| FR | 2756048 A1 | 5/1998 |
| FR | 2 949 007 A1 | 2/2011 |
| FR | 2 971 867 A1 | 8/2012 |
| JP | S63 6829 | 2/1988 |
| JP | 2000-163031 A | 6/2000 |
| JP | 2002-342033 A | 11/2002 |
| WO | WO-2013/120071 A1 | 8/2013 |
| WO | WO-2014/076708 A2 | 5/2014 |
| WO | WO-2014/076708 A3 | 5/2014 |
| WO | WO-2014/183932 A1 | 11/2014 |
| WO | WO-2014/188057 A1 | 11/2014 |
| WO | WO-2015/101700 A1 | 7/2015 |
| WO | WO-2016/067097 A1 | 5/2016 |

OTHER PUBLICATIONS

International Search Report dated Jun. 26, 2014 for PCT Application No. PCT/EP2014/057161, three pages.

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

Non-Final Office Action dated Jul. 25, 2017, for U.S. Appl. No. 14/891,958, filed Mar. 15, 2016, eight pages.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

Chinese Search Report dated Feb. 14, 2018 for CN Application No. 201480040202.7, with English translation, four pages.

Notice of Allowance dated Feb. 13, 2018, for U.S. Appl. No. 14/891,958, filed Mar. 15, 2016, eight pages.

Anonymous. (Aug. 17, 2017). "Indium tin oxide—Wikipedia", Mar. 29, 2013 (Mar. 29, 2013), XP055396619, Extrait de !'Internet: URL:https://en.wikipedia.org/w/index.php?title=Indium_tin_oxide &oldid=547596433[extrait le.

International Search Report dated Apr. 7, 2016 for PCT Application No. PCT/IB2015/002182, seven pages.

Non-Final Office Action dated Mar. 22, 2017, for U.S. Appl. No. 14/927,379, filed Oct. 29, 2015, eleven pages.

(56) References Cited

OTHER PUBLICATIONS

Notice of Allowance dated Sep. 13, 2017, for U.S. Appl. No. 14/927,379, filed Oct. 29, 2015, ten pages.

\* cited by examiner

MULTILAYER CAPACITIVE DETECTION DEVICE, AND APPARATUS COMPRISING THE DEVICE

CROSS-REFERENCE TO RELATED APPLICATIONS

This application is a National Phase application under 35 U.S.C. § 371 of International Application No. PCT/US2016/016472, filed Feb. 3, 2016, which claims the priority benefit of French Patent Application No. 1550843, filed Feb. 4, 2015, the contents of which are hereby incorporated by reference in their entireties for all intended purposes.

TECHNICAL FIELD

The present invention relates to a capacitive detection device designed to be superimposed on or integrated in a display screen, and which is arranged so as to minimize the stray interactions with the connecting tracks of the measuring electrodes. It also relates to a method for manufacturing the device, and an apparatus comprising such a device.

The field of the invention is more particularly, but not limited to that of touchscreen and contactless man-machine interfaces.

BACKGROUND OF THE INVENTION

Many apparatuses incorporate control interfaces or capacitive man-machine interfaces, superimposed on or integrated in a display screen.

These interfaces comprise capacitive measuring electrodes distributed over a detection surface, which are sensitive to the presence of a command object, such as a finger or a stylus.

These electrodes are often made in the form of depositions of layers of materials that are both substantially transparent and substantially electrically conductive, such as ITO (indium-tin oxide).

Configurations of control interfaces are known in which the measuring electrodes are distributed in the form of intersecting rows and columns. In this case, the electrodes extend to the edge of the detection surface and can therefore be directly connected to the control electronics.

The electrodes in rows and columns can be made by two distinct superimposed conductive layers, separated by an insulating layer.

The electrodes in rows and columns can also be made in the form of structures (for example of the diamond type) intertwined integrated into the same conductive layer. Conductive bridges are then made at the intersections between the rows and columns, usually with a thin layer of insulation and a deposition of conductive material or micro-wires. In this case, a configuration is obtained with a single conductive layer, which makes it possible to produce a thinner and potentially less expensive structure.

Also known are configurations of control interfaces in which the measuring electrodes are made in the form of individual electrodes distributed in a matrix arrangement in a conductive layer.

This matrix arrangement of the electrodes has advantages in terms of detection capacity. In particular, if it is implemented with sufficiently sensitive detection electronics, it makes it possible to unambiguously detect several control objects simultaneously, in contact and/or remotely.

Known for example is document WO 2011/015794, which describes a method and a control interface device that makes it possible to simultaneously detect a plurality of control objects in contact with and/or remotely from the interface. This interface comprises a matrix of capacitive measuring electrodes protected on their rear face by an active guard. The capacitive detection electronics make it possible to measure the capacitive coupling between the measuring electrodes and nearby objects (in the so-called "self capacitance" mode). In particular owing to the use of the guard, it has sufficient dynamics and sensitivity to allow the detection of objects in contact with the detection surface, and at a distance of up to several centimeters from this detection surface.

The electric matrix can be made in the form of a conductive layer with an ITO deposition. The active guard can also be made in the form of a conductive ITO layer placed below the layer of measuring electrodes (relative to the measuring zone) separated from that layer of electrodes by an insulating dielectric layer.

Typically, in these configurations, the measuring electrodes are individually connected to the control electronics by connecting tracks that are traced between them in the same conductive layer.

A stray coupling problem may then arise between the connecting tracks and the control objects. Indeed, when the control object is in the immediate vicinity of or in contact with the detection surface above a portion of the connecting track, a stray capacitive coupling is created between this connecting track and this object. This stray capacitive coupling can create a false detection, since it can be interpreted by the detection electronics as a coupling between the object and the measuring electrode to which the connecting track is connected.

The stray coupling between a connecting track and an object has a very low value, since, the track being very narrow, its surface across from the control object is very small. However, it may be sufficient to create disruptions in a capacitive interface capable of detecting objects remotely, since it is of the same order of magnitude as the capacitive coupling that is established between a measuring electrode and an object at a distance from the electrode. Thus, a finger in contact with a connecting track can be interpreted as an object present at a distance from the measuring electrode to which the track is connected.

To correct this problem, it is known to have a conductive layer above the layer of electrodes (relative to the detection surface) with a guard mask. This guard mask is arranged so as to extend above the connecting tracks, and comprises openings across from the measuring electrodes. Thus, a control object near or in contact with the detection surface can only generate capacitive coupling with the electrodes and not with the connecting tracks, since they are protected by the guard mask. Known for example are documents JP 2009-86240 and WO 2014/076363, which describe such configurations.

However, this solution has the drawback of requiring an additional layer of conductive material, which is detrimental in terms of thickness and cost.

The present invention aims to propose a capacitive detection device with individual measuring electrodes that make it possible to resolve the drawbacks of the prior art.

The present invention also aims to propose such a capacitive detection device that makes it possible to minimize the stray interactions with the connecting tracks.

The present invention also makes it possible to propose such a capacitive detection device that can be implemented with a minimum of conductive layers.

The present invention also aims to propose such a capacitive detection device that has a minimum thickness.

The present invention also aims to propose such a capacitive detection device able to be superimposed on or integrated in a display screen, and compatible with the production techniques typically used.

DESCRIPTION OF THE INVENTION

This aim is achieved with a capacitive detection device comprising a plurality of individual capacitive measuring electrodes distributed according to a measuring surface, and connecting tracks respectively connected to said measuring electrodes, said device being characterized in that the measuring electrodes and the connecting tracks are arranged in two visually transparent separate layers separated by an electrically insulating insulation material.

The capacitive detection device according to the invention can thus comprise a plurality of measuring electrodes usable individually to perform a capacitive coupling measurement with one or more nearby objects of interest. It can also comprise connecting tracks that make it possible to connect the electrodes (or each electrode) individually to detection electronics outside the measuring surface.

The capacitive detection device according to the invention can be made in the form of a series or stack of layers of material, including a layer with the measuring electrodes, a layer with the connecting tracks, and a layer of insulation material inserted between the electrodes and the connecting tracks.

The distribution in a layer must be interpreted as a superposition of zones with the different cited materials, but it must also be understood that the separations are not necessarily strict and the materials of certain layers (such as the insulating material) can also be present in certain other layers (such as the layer with the measuring electrodes).

The layers are called "visually transparent" (or transparent) inasmuch as they are at least transparent enough to make it possible to view, under acceptable conditions by transparency, an image for example from a display screen on which the capacitive detection device would be superimposed or in which it would be integrated.

The capacitive detection device according to the invention can thus be globally visually transparent or transparent.

According to embodiments, the capacitive detection device according to the invention may comprise an insulation material arranged in the form of an insulating layer extending across from the measuring electrodes.

The capacitive device according to the invention may also comprise through electrical connections between said measuring electrodes and the connecting tracks.

In that case, the insulating material can be distributed so as to cover at least the rear face (relative to the measuring surface) of the electrodes. The connecting tracks can be connected to "their" electrode using an electrical connection through openings in the layer of insulating material.

According to embodiments, the capacitive detection device according to the invention can comprise an insulating material essentially located between the connecting tracks and the measuring electrodes not connected to said connecting tracks.

In this case, the insulating material can be placed only or essentially between the connecting tracks and the electrodes to be isolated from those tracks, for example following the outline of those tracks.

According to embodiments, the capacitive detection device according to the invention may comprise:
- an organic insulating material;
- a mineral insulating material;
- a resin or a photoresist polymer;
- an insulating material with a thickness smaller than 10 microns;
- an insulating material with a thickness smaller than 5 microns;
- an insulating material with a thickness comprised between 1 micron and 4 microns.

According to embodiments, the capacitive detection device according to the invention may comprise measuring electrodes distributed according to any one of the following arrangements:
- in a matrix arrangement;
- in an arrangement of orthogonal or substantially orthogonal rows and columns;
- in an arrangement of rows and columns forming an angle different from 90 degrees between them;
- in an arrangement having a circular structure or symmetry;
- in any arrangement compatible with the measuring needs.

According to embodiments, the capacitive detection device according to the invention may comprise measuring electrodes and/or connecting tracks made with any one of the following materials:
- a globally transparent and electrically conductive material;
- a transparent conducting oxide (TOO), for example with a base of zinc oxide (ZnO, etc.), tin oxide, aluminum-doped zinc oxide (AZO), indium oxide, cadmium oxide;
- ITO (indium-tin oxide);
- a material with a base of sub-micrometric metal wires, i.e., comprising metal wires with a diameter smaller than a micrometer, or even nanometric, for example made from silver;
- a material of the "metal mesh" type, based on a mesh or array of metal wires with a sub-nanometric or even nanometric diameter;
- a material with a base of carbon or graphene nanotubes.

The term "electrically conductive material" refers to a material conductive enough for the considered capacitive detection application, with the understanding that this material can be very resistive.

Of course, the measuring electrodes and the connecting tracks can be made from different materials.

The connecting tracks can also be made with metal depositions several microns wide.

According to embodiments, the capacitive detection device according to the invention may further comprise a guard plane made in the form of a layer of electrically conductive material arranged opposite the measuring electrodes relative to the connecting tracks.

This guard plane is in particular used to protect the measuring electrodes from stray capacitive couplings with the environment. It is preferably polarized at the same potential as the measuring electrodes, so as to produce an active guard.

According to embodiments, the capacitive detection device according to the invention may further comprise at least one so-called "electric guard" plane made from a conductive material inserted between at least part of the measuring electrodes.

This or these electric guard plane(s) can in particular be made in the same layer as the measuring electrodes.

The capacitive detection device according to the invention can also comprise connecting tracks positioned at least partially across from an electric guard plane.

Thus, the capacitive detection device according to the invention can comprise connecting tracks, at least some parts of which pass below an electrode guard plane, relative to the measuring surface. This electrode guard plane is in particular used to protect the connecting tracks from stray capacitive couplings with objects of interest in contact with or above the measuring surface. It is preferably polarized at the same potential as the measuring electrodes and the connecting tracks, so as to produce an active guard.

According to embodiments, the capacitive detection device according to the invention can comprise connecting tracks positioned at least partially across from measuring electrodes.

In this case, it can comprise connecting tracks whereof at least some parts pass below the measuring electrodes, relative to a detection surface.

According to embodiments, the capacitive detection device according to the invention can comprise connecting tracks positioned partially across from the measuring electrodes and partially across from electric guard planes.

According to another aspect, a method is proposed for producing a capacitive detection device comprising a plurality of individual capacitive measuring electrodes distributed according to a measuring surface and connecting tracks respectively connected to said measuring electrodes, said method comprising steps for producing measuring electrodes and connecting tracks in the form of two visually transparent separate layers separated by an electrically insulating insulation material.

The method according to the invention may in particular comprise the steps consisting of:
  depositing, on a dielectric substrate, a layer of electrically conductive material, structured so as to produce at least the measuring electrodes;
  depositing a layer of insulating material;
  depositing a layer of electrically conductive material, structured so as at least to produce the connecting tracks.

According to modes of implementation, the method according to the invention may further comprise steps consisting of:
  depositing, on a second dielectric substrate, a layer of electrically conductive material structured so as to produce a guard plane;
  gluing (or rolling) said guard plane on the layer making up the connecting tracks and/or in the layer of insulating material using an optically clear adhesive (OCA).

According to another aspect, an apparatus is proposed comprising a display device and a capacitive detection device according to the invention.

According to embodiments:
  the capacitive detection device can be superimposed on the display screen.
  the apparatus according to the invention can comprise a display device of the LCD (Liquid Crystal Display) or OLED (Organic Light-Emitting Diodes) type, and a capacitive detection device at least partially integrated into the component layers of the display device.

The apparatus according to the invention can particular be one of the following types: smartphone, tablet, computer, display device or screen.

According to modes of implementation, the capacitive detection device according to the invention can be used as a capacitive interface device to control an apparatus. In this case, it is used to detect objects of interest (such as fingers, a stylus, etc.) that are used as control objects to interact with the apparatus.

The invention therefore makes it possible to produce a capacitive detection device or a capacitive interface device based on a matrix of individual electrodes in which the measurements are not disrupted by the connecting tracks. Indeed, inasmuch as these connecting tracks are essentially located below the electrodes or below the electrode guard plane, no significant capacitive coupling can be established between them and the control objects.

Owing to the use of a very thin organic insulator, the routing of the tracks over a layer different from the layer of electrodes does not cause a significant increase in thickness.

Furthermore, the manufacturing method according to the invention is fully compatible with the current industrial methods used for mass production, since it implements an organic insulator that is normally used only to produce local bridges, for example to produce intersections of tracks or electrodes in a same layer.

The invention thus comprises both an original capacitive detection device architecture and an equally original manufacturing method, inasmuch as it bypasses the industrial method steps normally used in another way.

DESCRIPTION OF FIGURES AND DETAILED DESCRIPTION OF THE INVENTION

Figure 2:
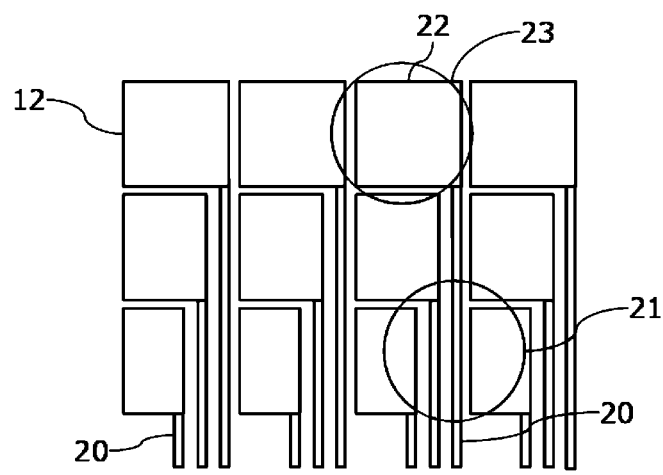
Figure 3:
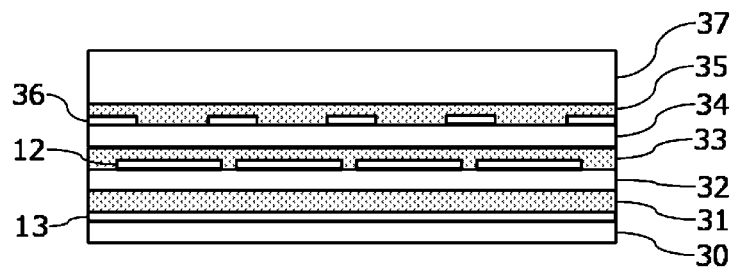
Figure 4:
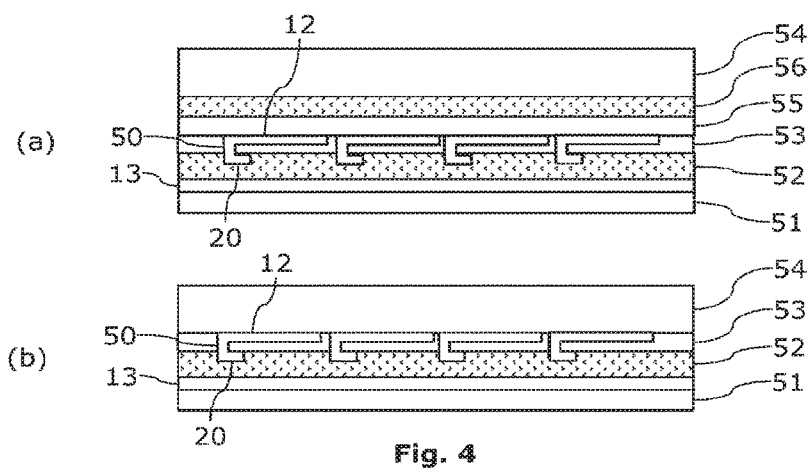
Figure 5:
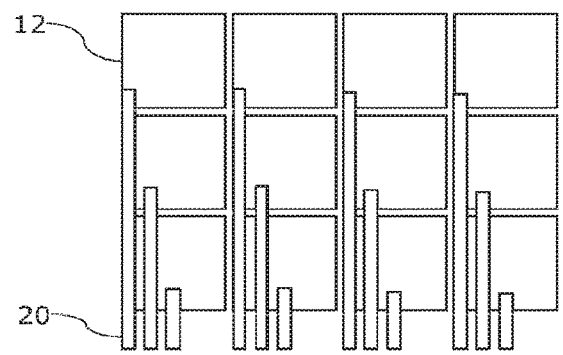
Figure 6:
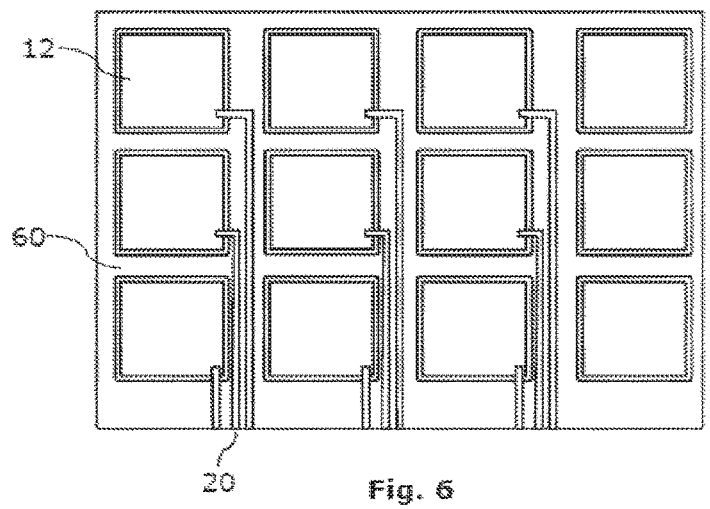

Other advantages and specificities of the invention will appear upon reading the detailed description of non-limiting implementations and embodiments, and the following appended drawings:

FIG. 1 shows a block diagram of a capacitive interface device according to the invention, FIG. 2 illustrates a capacitive interface device of the prior art, with measuring electrodes and connecting tracks made on the same layer, FIG. 3 illustrates an example of structures of layers in a capacitive interface device of the prior art, FIG. 4($a$) and FIG. 4($b$) illustrate examples of structures of layers in capacitive interface devices according to the invention, FIG. 5 illustrates an embodiment of a capacitive interface device according to the invention, in bottom view, FIG. 6 illustrates another embodiment of a capacitive interface device according to the invention, with a guard plane between the electrodes.

It is understood that the embodiments described below are in no way limiting. It is in particular possible to consider alternatives of the invention only comprising a selection of the features described below isolated from the other described features, if this selection of features is sufficient to impart a technical advantage or to differentiate the invention from the state of the art. This selection comprises at least one, preferably functional feature without structural details, or with only some of the structural details if this part alone is sufficient to impart a technical advantage or to differentiate the invention from the state of the art.

In particular, all of the alternatives and embodiments described can be combined with one another if nothing precludes that combination on a technical level.

In the figures, elements shared by several figures retain the same reference.

In reference to FIG. 1, we will first describe a block diagram of a capacitive interface device according to the invention.

In the described embodiment, this interface device is designed to be superimposed on the display screen 14. It comprises capacitive measuring electrodes 12 distributed over a surface or a measuring panel 11 (or at least across from such a surface). These electrodes 12 are arranged in a matrix arrangement.

The capacitive interface device also comprises a guard 13 made from a conductive material that is inserted between the display screen 14 and the electrodes 12, along their rear face (relative to the measuring surface 11). This guard 13 is polarized at the same potential as the electrodes 12. It is intended to protect the electrodes 12 from stray couplings with the display 14 or the apparatus, preventing the appearance of leak capacitances.

The capacitive electrodes 12 are connected to capacitive detection electronics 15 that make it possible to determine, by measuring the direct capacitive coupling ("self capacitance" mode), the position (X, Y, Z) of objects of interest or control objects 10 in contact with the measuring surface 11 or nearby in a detection zone. More specifically, the capacitive detection electronics 15 make it possible to measure the capacitance that is established between the electrodes 12 and the control object(s) 10. Since the capacitance between the measuring electrode 12 and a control object 10 is an inverse function of the distance that separates them, distance information (Z) of the control object 10 relative to the electrode 12 can be directly deduced. The position of the measuring surface 11 of the electrode 12 makes it possible to locate the position (X, Y) of the control object 10 in the plane of this measuring surface 11.

Different types of detection electronics 15 can be implemented in the context of the invention.

It is for example possible to implement a detection principle based on a charge amplifier and an active guard. The electrodes 12 are excited at an excitation potential, for example by an oscillator. For the measurement, they are connected to an assembly of the charge amplifier type that generates an output voltage depending on the capacitance between these measuring electrodes 12 and one or more control objects 10. The guard 13 is polarized at the same potential as the electrodes 12, for example by a voltage follower assembly. Thus, no stray capacitances can appear between the guard 13 and the electrodes 12, since they are at the same potential.

A detection principle may also be implemented based on electronics referenced at a floating potential, as for example described in document WO 2011/015794. In this case, the detection electronics 15 comprise a sensitive part, connected to the electrodes 12, which is referenced at an alternating reference potential for example generated by an oscillator. This sensitive part also comprises a charge amplifier-type assembly that generates an output voltage depending on the capacitance between the measuring electrodes 12 and one or more control objects 10. The guard 13 is also polarized at this alternating reference potential. Thus, as before, inasmuch as the guard 13 is polarized at the same potential as the electrodes 12, no stray capacitances can appear between them. This assembly further has the advantage that it makes it possible to avoid the appearance of stray capacitances at the sensitive part of the electronics, which is also referenced at the alternating reference potential. One thus obtains better sensitivity and better robustness to disruptions, which in particular makes it possible to detect control objects 10 at a greater distance from the control surface 11.

In the two described examples, the detection electronics 15 can comprise scanners or switches that make it possible to connect the measuring electrodes 12 sequentially to the detection electronics 15, to measure their respective coupling capacitances with the control objects 10. In this case, preferably, the electrodes 12 that are not active are connected to the guard potential to avoid stray capacitances. Thus, the electrodes 12 are always at a potential substantially equal to the guard potential, whether they are active (connected to the detection electronics 15) or not.

In the two described examples, the detection electronics 15 can also comprise several detection paths operating in parallel, so as to "query" several measuring electrodes 12 at the same time.

Inasmuch as the capacitive interface device according to the invention is designed to be superimposed on (or integrated in) a display screen 14, the elements making it up, including the measuring electrodes 12 and the guard plane 13, must be transparent enough to allow viewing of the display under good conditions.

According to the most commonly used industrial techniques, the measuring electrodes 12 and the guard plane 13 are made by depositing sufficiently conductive and transparent materials, such as ITO (indium-tin oxide).

In order to measure the coupling capacitances between the electrodes 12 and the control objects 10, it is necessary to be able to connect all of the electrodes 12 of the measuring panel 11 individually to the detection electronics 15.

In reference to FIG. 2, in the capacitive devices of the prior art, the connection between the electrodes 12 and the detection electronics 15 is done using connecting tracks 20 made from ITO traced or deposited in the same layer as the measuring electrodes 12.

This arrangement has drawbacks. Indeed, the tracks must pass between the electrodes. This requires separating the electrodes, which causes a loss of spatial resolution, and/or varies the size of the electrodes based on the number of tracks to be passed between them, as illustrated in FIG. 2. In the latter case, sensitivity differences are also introduced between these electrodes 12.

When the connecting tracks 20 are made from ITO, they must have a relatively large width, for example in the range of 100 μm, to limit the resistivity thereof. Thus, in addition to the width necessary for the passage between the electrodes 12, they also constitute surfaces that can couple capacitively with nearby objects 10, and disrupt the measurements.

This situation is illustrated in FIG. 2. One may consider that a control object 10 in the form of a finger in contact with the measuring surface through a protective glass in the zone shown by the circle 21 creates, on the connecting track 20 of an electrode 22, a coupling capacitance of approximately 100 ff. This capacitance, when measured by the detection electronics 15, is interpreted as an object 10 "seen" by this electrode 22, and therefore located in the position shown by the circle 23 across from this electrode 22. Yet this capacitance of 100 ff corresponds to the capacitive coupling with the electrode 22 of a finger situated approximately 2 mm from the electrode 22. It is thus possible to create very bothersome "ghost" detections.

This estimate is obtained by applying the formula of the disc capacitor:

$$C = \varepsilon_0 \varepsilon_r S/D,$$

where $\varepsilon_0$ is the dielectric permittivity of the vacuum, $\varepsilon_r$ is the relative permittivity of the material, S is the equivalent surface of facing electrodes, and D is their distance. For the calculations, a finger is considered with a diameter of 10 mm, and a protective glass with a thickness of 0.8 mm and relative permittivity $\varepsilon_r = 7.4$.

In order to avoid disruptions caused by stray couplings with the connecting tracks, the devices of the prior art often comprise an upper guard plane arranged so as to cover these connecting tracks.

FIG. 3 illustrates a representative example embodiment of a capacitive interface device of the prior art, with such an upper guard.

This capacitive interface device comprises a series of conductive layers made in the form of ITO depositions deposited on dielectric substrates. These layers are next assembled by layers of optically clear adhesive (OCA) with a thickness in the range of 25 µm to 50 µm. The dielectric substrate can for example be PET (polyethylene terephthalate) with a thickness of approximately 25 µm to 100 µm, or glass.

More specifically, the interface device as illustrated in FIG. 3 comprises:
- a dielectric guard substrate 30;
- a guard plane 13, made in the form of an ITO layer deposited on the dielectric guard substrate 30;
- a first optically clear adhesive layer 31;
- a dielectric electrode substrate 32;
- measuring electrodes 12 and connecting tracks 20 made in the form of a layer of ITO deposited on the dielectric electrode substrate 32;
- a second optical adhesive layer 33;
- an upper guard dielectric substrate 34;
- an upper guard plane 36, made in the form of a layer of ITO deposited on the upper guard dielectric substrate 34;
- a third optical adhesive layer 35;
- a protective glass 37.

As previously explained, the upper guard plane 36 is designed to protect the connecting tracks from interactions with control objects 10. It therefore essentially extends above the spaces between the measuring electrodes 12 in which these connecting tracks are inserted.

This arrangement has the drawback of requiring a layer of ITO above the layer of electrodes and tracks, to produce the upper guard. Yet the implementation of this layer of ITO also requires a layer of substrate (made from PET) and an additional layer of optical adhesive. This in particular results in an increase in the total thickness of the interface, a loss of transparency and an excess cost. This excess cost is in particular created by the presence of an additional rolling step (i.e., adhering on the optical adhesive layer) during manufacturing.

Example embodiments of structures of layers in the capacitive interface according to the invention will now be described in reference to FIG. 4(a) and FIG. 4(b).

In the embodiment shown in FIG. 4(a), the interface device comprises:
- a conductive layer, for example made from ITO, with the measuring electrodes 12. This conductive layer is deposited on a dielectric electrode substrate 55, for example made from PET (polyethylene terephthalate) with a thickness in the range of 25 µm to 100 µm;
- a layer of insulating material 53, which is deposited on the layer of measuring electrodes 12. This insulating material 53 is an organic insulator normally used in the form of very localized depositions to produce bridges, i.e., connections between elements of the layer of electrodes that straddle other electric connections of that same layer of electrodes. In the context of the invention, it is used in the form of a separating layer between the electrodes 12 and the connecting tracks 20. This insulator has the advantage of making it possible to produce very thin layers, in the range of 1 to 2 µm. As a non-limiting example, the insulating material 53 can be a polymer or a photoresist resin of the type of those used in photolithography;
- connecting tracks 20 made in the form of a conductive layer, for example made from ITO. These connecting tracks 20 are made in the form of a layer separate from the layer of electrodes 12, which is deposited on the layer of insulating material 53.

They are each connected to a measuring electrode 20 by a connection made through the layer of insulating material 53, for example made from ITO;
- a conductive guard layer that forms a guard plane 13. This conductive guard layer is deposited on a dielectric guard substrate 51, for example made from PET.
- a protective glass 54, the surface of which constitutes or embodies the measuring surface;
- a first optically clear adhesive (OCA) layer 52, placed between the layer of insulating material 52 with the connecting tracks 20 and the guard plane 13;
- a second optically clear adhesive (OCA) layer 56, placed between the dielectric electrode substrate 55 and the protective glass 54.

The layers of optically clear adhesive typically have a thickness of approximately 25 µm to 75 µm.

The interface device shown in FIG. 4(a) can for example be made by carrying out the following steps.
- producing a first assembly made up of the dielectric electrode substrate 55, measuring electrodes 12, the insulating layer 53 and the connecting tracks 20, in particular with steps for depositing layers;
- producing a second assembly made up of the dielectric guard substrate 51 and the guard layer 13;
- an assembly of these first and second assemblies, as well as protective glass 54, by adhesion using the optically clear adhesive.

It should be noted that the first and second assemblies are assembled in the form of a sandwich with the measuring electrodes 12, the connecting tracks 20 and the guard 13 facing one another between the dielectric electrode substrate 55 and the dielectric guard substrate 51.

FIG. 4(b) illustrates a second embodiment of a structure of layers in an interface device according to the invention.

This embodiment differs from that of FIG. 4(a) in that the measuring electrodes 12, the insulating layer 53 and the connecting tracks 20 are deposited directly on the protective glass 54. This makes it possible to produce a thinner system, since it comprises one less substrate layer and optically clear adhesive layer.

With the exception of these differences, the interface device of FIG. 4(b) and its manufacturing method are identical to the one of FIG. 4(a), consequently everything described in relation to the embodiment of FIG. 4(a) is applicable to the embodiment of FIG. 4(b).

FIG. 5 illustrates an embodiment of the invention in which the connecting tracks 20 are placed below the measuring electrodes 12. This arrangement is made possible with the invention because these connecting tracks 20 are on a different layer from the measuring electrodes 12. This embodiment can in particular be done with the layer structures shown in FIG. 4(a) and FIG. 4(b). It has advantages:
- the measuring electrodes 12 can have the same dimensions;
- the connecting tracks can only be capacitively coupled with control objects 10 in the spaces between the electrodes 12, therefore with very limited exposed surfaces.

FIG. 6 illustrates an embodiment of the invention in which an electrode guard plane 60 is introduced between the measuring electrodes 12, in the same layer. In practice, the measuring electrodes 12 and the electric guard plane 60 are made in a same layer of ITO, structured accordingly. The electrode guard plane 60 is polarized at the same potential as the guard plane 13.

The connecting tracks 20, which as before are found on a different layer from the measuring electrodes 12, are essentially placed below the electrode guard plane 60, which thus serves to protect them electrically. This arrangement has the advantage of allowing a minimization of the possibilities for stray couplings between the connecting tracks 20 and the control objects 10. Indeed, in the arrangement of FIG. 6, the connecting tracks 20 cannot be exposed to such a stray coupling except in the interval between the measuring electrode 12 to which they are connected and the electrode guard plane 60.

This embodiment can in particular be done with the layer structures shown in FIG. 4(a) and FIG. 4(b).

According to embodiments, the capacitive measuring interface according to the invention can be integrated in the display screen. It can in particular be integrated into a screen with a base of LCD matrices (liquid crystal display) or with an OLED (organic light-emitting diodes) base.

It can in particular comprise a measuring layer and/or a lower guard layer inserted in the layers of the display.

It can also comprise a measuring layer and/or a lower guard layer shared or merged with a control layer of the display. In particular, it can comprise a measuring layer or a lower guard layer merged with the shared potential layer of the display, for example corresponding to the so-called "Vcom" layer of an LCD matrix-based display or the "anode" layer of an OLED-based display.

Of course, the invention is not limited to the examples described above, and many alterations can be made to these examples without going beyond the scope of the invention.

The invention claimed is:

1. A capacitive detection device, comprising:
a plurality of individual capacitive measuring electrodes distributed along a measuring surface and connecting tracks respectively connected to said measuring electrodes, the measuring electrodes arranged in a first layer and the connecting tracks arranged in a second layer separated by an electrically insulating insulation material; and
a first guard plane formed on the first layer between the plurality of measuring electrodes but electrically isolated from the measuring electrodes;
wherein the connecting tracks are routed from the measuring electrodes to an edge of the detection device below the first guard plane and between the measuring electrodes to reduce stray capacitive coupling between the connecting tracks and an object.

2. The device according to claim 1, wherein the insulation material is arranged in the form of an insulating layer supporting the measuring electrodes.

3. The device according to claim 1, wherein the insulating material is located between the connecting tracks and the measuring electrodes.

4. The device according to claim 1, further comprising an organic insulating material.

5. The device according to claim 1, wherein the insulating material is formed with a thickness smaller than 10 microns.

6. The device according to claim 1, wherein the measuring electrodes are formed according to any one of the following arrangements:
according to a matrix arrangement;
according to an arrangement of orthogonal rows and columns;
according to an arrangement of rows and columns forming an angle different from 90 degrees between them; and
according to an arrangement having a circular structure or symmetry.

7. The device according to claim 1, wherein the measuring electrodes or connecting tracks are made with any one of the following materials:
a globally transparent and electrically conductive material;
a transparent conductive oxide;
ITO (indium-tin oxide);
a material with a base of sub-micrometric metal wires;
a material of the "metal mesh" type; and
a material with a base of carbon or graphene nanotubes.

8. The device according to claim 1, further comprising a second guard plane made in the form of a layer of electrically conductive material arranged opposite the measuring electrodes relative to the connecting tracks.

9. The device according to claim 1, wherein the first guard plane is maintained at a same potential as at least some of the measuring electrodes.

10. An apparatus comprising a display device and a capacitive detection device according to claim 1.

11. The apparatus of claim 10, wherein the capacitive detection device is superimposed on the display device.

12. The apparatus according to claim 10, wherein the display device is of an LCD or OLED type, and the capacitive detection device is at least partially integrated into layers making up the display device.

13. The apparatus according to claim 10, which is of one of the following types: smartphone, tablet, computer, display device or screen.

14. A method for producing a capacitive detection device comprising a plurality of individual capacitive measuring electrodes distributed according to a measuring surface and connecting tracks respectively connected to said measuring electrodes, said method comprising:
producing measuring electrodes in a first layer and connecting tracks in a second layer separated by an electrically insulating insulation material;
forming a guard plane on the first layer between the measuring electrodes but electrically isolated from the measuring electrodes; and
routing the connecting tracks from the measuring electrodes to an edge of the detection device below the guard plane and between the measuring electrodes to reduce stray capacitive coupling between the connecting tracks and an object.

15. The method according to claim 14, further comprising:
depositing on a dielectric substrate a layer of electrically conductive material structured so as to produce at least the measuring electrodes;
depositing a layer of insulating material; and
depositing a layer of electrically conductive material, structured so as at least to produce the connecting tracks.

16. The method according to claim 15, further comprising:
depositing a layer of electrically conductive material structured so as to produce the guard plane; and gluing said guard plane on one of the layer making up the connecting tracks and the layer of insulating material using an adhesive.

\* \* \* \* \*